(12) United States Patent
Yen et al.

(10) Patent No.: US 12,046,497 B2
(45) Date of Patent: Jul. 23, 2024

(54) TRANSFER SYSTEM FOR WAFER CASSETTES

(71) Applicant: VisEra Technologies Company Ltd., Hsin-Chu (TW)

(72) Inventors: Yi-Feng Yen, Hsin-Chu (TW); Shih-Lung Hsu, Hsin-Chu (TW); Kuo-Hsing Teng, Hsin-Chu (TW); Cheng-Hsiung Tung, Hsin-Chu (TW)

(73) Assignee: VisEra Technologies Company Ltd., Hsin-Chu (TW)

( * ) Notice: Subject to any disclaimer, the term of this patent is extended or adjusted under 35 U.S.C. 154(b) by 165 days.

(21) Appl. No.: 17/879,651

(22) Filed: Aug. 2, 2022

(65) Prior Publication Data
US 2024/0047249 A1  Feb. 8, 2024

(51) Int. Cl.
*H01L 21/673* (2006.01)
*H01L 21/677* (2006.01)

(52) U.S. Cl.
CPC .... *H01L 21/67333* (2013.01); *H01L 21/6773* (2013.01)

(58) Field of Classification Search
CPC ........... H01L 21/67333; H01L 21/6734; H01L 21/6773; H01L 21/67346; H01L 21/67356; H01L 21/67363; H01L 21/67353; H01L 21/67359; H01L 21/67383; H01L 21/673

USPC ................................ 206/710, 701, 724, 722
See application file for complete search history.

(56) References Cited

U.S. PATENT DOCUMENTS

2008/0173569 A1 * 7/2008 Forsyth ............. H01L 21/67333
206/725

FOREIGN PATENT DOCUMENTS

KR  100292664 B1 * 7/2001
KR  20060121680 A * 11/2006
WO  WO-2004032208 A1 * 4/2004 ....... H01L 21/67353

* cited by examiner

*Primary Examiner* — Rafael A Ortiz
(74) *Attorney, Agent, or Firm* — LIU & LIU

(57) ABSTRACT

A transfer system for wafer cassettes includes a tray and a rail compatible with the tray. The tray includes a base plate, a through hole, a wall, and a pair of first positioning features. The through hole is disposed on a center of the base plate, in which the through hole has a first direction axis and a second direction axis perpendicular to the first direction axis. The wall extends from a surface of the base plate and surrounding the through hole, in which the wall separates the base plate into an interior region and an exterior region. The pair of first positioning features having a first level height are in the interior region and arranged parallel to the first direction axis.

20 Claims, 16 Drawing Sheets

TRANSFER SYSTEM FOR WAFER CASSETTES

BACKGROUND

Field of Invention

The present disclosure relates to a transfer system for wafer cassettes. More particularly, the present disclosure relates to different kinds of trays for wafer cassettes.

Description of Related Art

With the development of semiconductor factory automation, there are many transport methods for wafer automatic transportations. Wafer cassettes could be used to transport or store wafers during processes to protect wafers from being contaminated. One wafer automatic transportation unit is limited by one single-sized wafer cassette. If there are different sizes of wafer cassettes, multiple wafer automatic transportation units are needed, which increases the cost of production and limits the commonality of wafer automatic transportation. In addition, in the case that different types of wafers (for the same size of wafer cassettes) are produced in one wafer fab and the size specifications of wafer cassettes are different, the different types of wafers could not satisfy all the wafer automatic transportation units. Therefore, there is a need to solve the above problems.

SUMMARY

One aspect of the present disclosure is to provide a transfer system for wafer cassettes. The transfer system includes a tray and a rail compatible with the tray. The tray includes a base plate, a through hole, a wall, a pair of first positioning features, a pair of second positioning features, a pair of third positioning features, and a pair of fourth positioning features. The through hole is disposed on a center of the base plate, in which the through hole has a first direction axis and a second direction axis perpendicular to the first direction axis. The wall extends from a surface of the base plate and surrounding the through hole, in which the wall separates the base plate into an interior region and an exterior region. The pair of first positioning features having a first level height are in the interior region and arranged parallel to the first direction axis. The pair of second positioning features having a second level height are in the interior region and arranged parallel to the first direction axis, in which the first level height is greater than the second level height. The pair of third positioning features having a third level height are in the interior region and arranged parallel to the first direction axis. The pair of fourth positioning features having a fourth level height are in the interior region and arranged parallel to the first direction axis, in which the third level height is greater than the fourth level height. A minimum distance between the each first positioning feature and the second direction axis is greater than a minimum distance between the each second positioning feature and the second direction axis. A minimum distance between the each third positioning feature and the first direction axis is greater than a minimum distance between the each fourth positioning feature and the first direction axis. In some embodiments, the first direction axis and the second direction axis intersect in a center of the through hole.

In some embodiments, the wall includes a first inner surface, a second inner surface, a third inner surface, and a fourth inner surface. The second inner surface and the third inner surface respectively adjoin and are perpendicular to two sides of the first inner surface of the wall, and the second inner surface and the third inner surface are parallel to each other. The second inner surface and the third inner surface respectively adjoin and are perpendicular to two sides of the fourth inner surface of the wall, and the first inner surface and the fourth inner surface are parallel to each other. A distance between the second inner surface of the wall and the first direction axis is greater than the minimum distance between the each third positioning feature and the first direction axis.

In some embodiments, the pair of first positioning features are relatively disposed on two sides the first direction axis, and the pair of first positioning features are disposed on the first inner surface of the wall.

In some embodiments, each of the second positioning features relatively adjoins each of the first positioning features, and each of the second positioning features relatively is disposed on the second inner surface and the third inner surface of the wall.

In some embodiments, the pair of third positioning features are relatively disposed on two sides the first direction axis, and each of the third positioning features is relatively disposed on the second inner surface and the third inner surface of the wall.

In some embodiments, the pair of fourth positioning features are relatively disposed on two sides the first direction axis, and each of the fourth positioning features is relatively disposed on each of the third positioning features.

In some embodiments, the transfer system further includes a fifth positioning feature having a fifth level height in the interior region and arranged between the pair of first positioning features. The first level height and the second level height are greater than the fifth level height.

In some embodiments, the transfer system further includes a recess in the fifth positioning feature.

In some embodiments, the first direction axis passes through a center of the fifth positioning feature and a center of the recess.

In some embodiments, the minimum distance between the each second positioning feature and the second direction axis is greater than a minimum distance between the recess of the fifth positioning feature and the second direction axis.

In some embodiments, the transfer system further includes a sixth positioning feature having a sixth level height in the interior region. A distance between the fourth inner surface of the wall and the second direction axis is greater than a minimum distance between the sixth positioning feature and the second direction axis.

In some embodiments, the first direction axis passes through a center of the sixth positioning feature.

In some embodiments, the transfer system further includes a first gap channel and a second gap channel. The first gap channel separates each of the third positioning features into two third portions and separates each of the fourth positioning features into two fourth portions. The second gap channel separates the fifth positioning feature into two fifth portions and separates the sixth positioning feature into two sixth portions.

In some embodiments, the pair of first positioning features, the pair of second positioning features, the pair of third positioning features, and the pair of fourth positioning features extend from the surface of the base plate.

In some embodiments, the transfer system further includes a plurality of seventh positioning features having a seventh level height in the interior region and a plurality of eighth positioning features having an eighth level height in the interior region. The plurality of seventh positioning features are arranged adjacent to four corners of the wall, and the seventh level height is below the surface of the base plate. The plurality of eighth positioning features are arranged adjacent to four corners of the wall, and the eighth level height is below the surface of the base plate.

In some embodiments, the transfer system further includes different types of first wafer cassettes in the transfer system, and the tray is compatible with the different types of first wafer cassettes.

In some embodiments, the transfer system further includes a second wafer cassette in the transfer system. A length of the tray is the same as a length of the second wafer cassette, and a width of the tray is the same as a width of the second wafer cassette.

In some embodiments, the transfer system further includes a radio frequency identification tag disposed on the base plate.

In some embodiments, the transfer system further includes a pair of handle structures extending from the surface of the base plate and disposed in the exterior region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
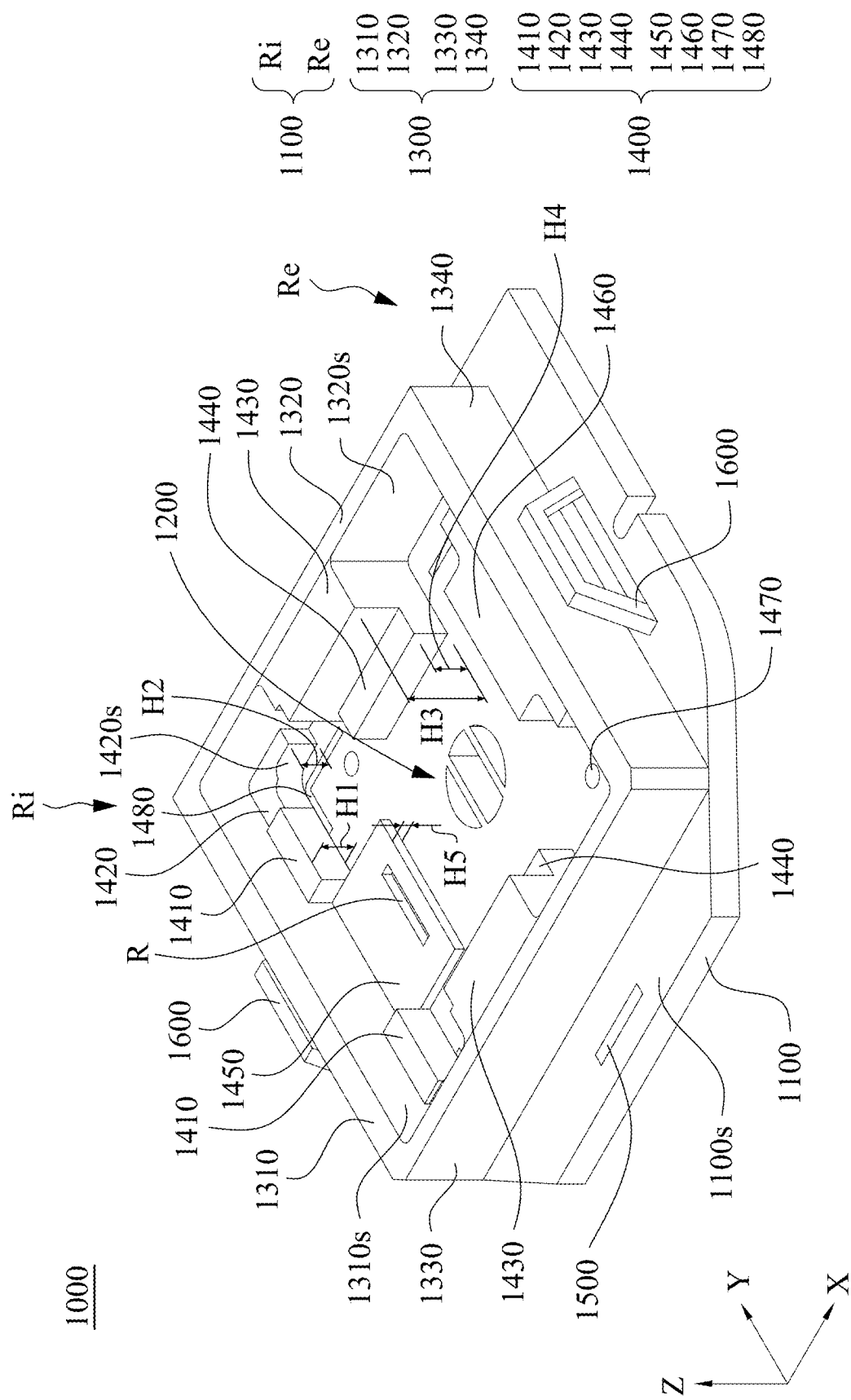
FIG. 1 and FIG. 2 are three-dimensional views of a tray in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It should be understood that the number of any elements/components is merely for illustration, and it does not intend to limit the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
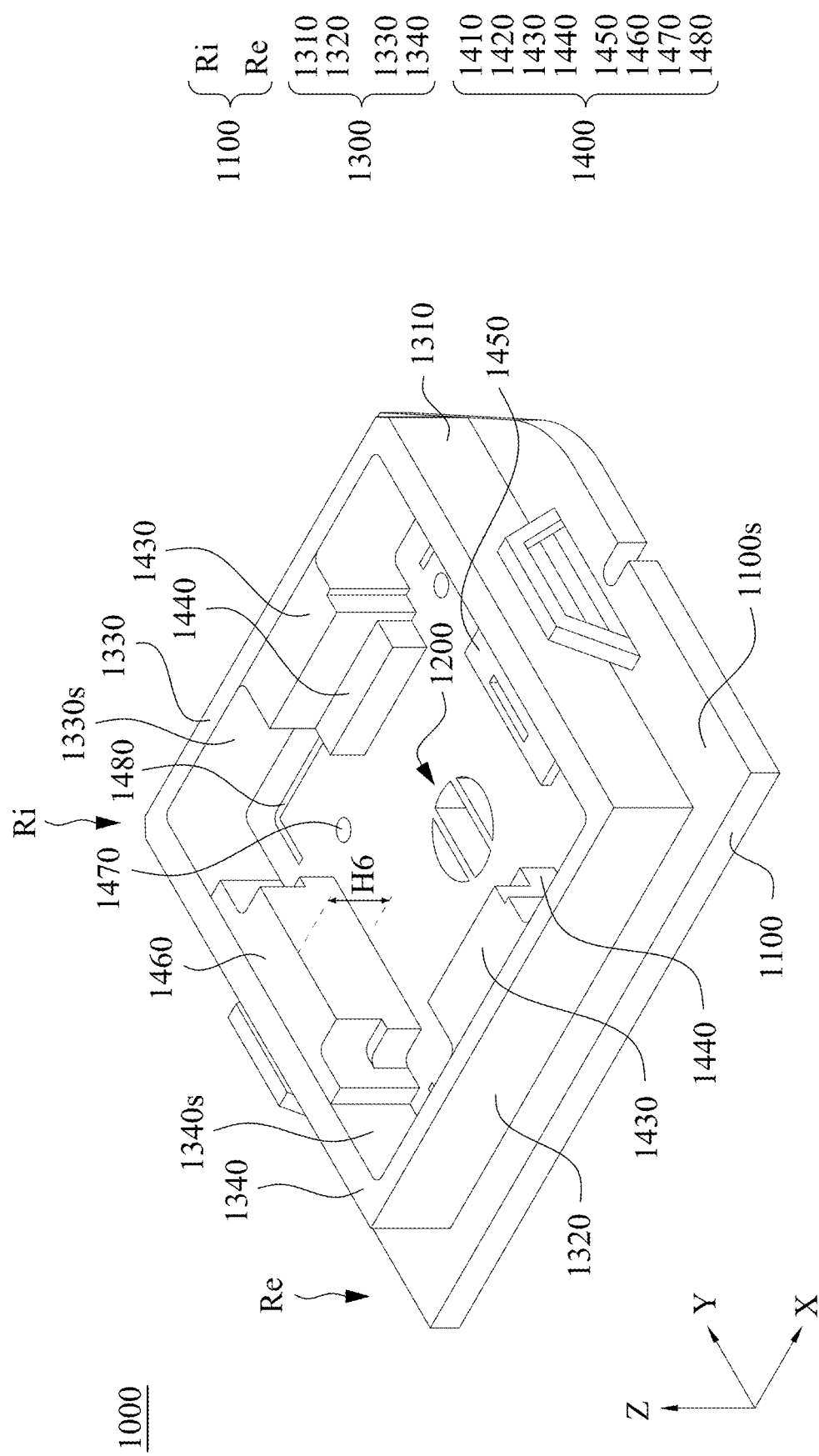
Figure 3:
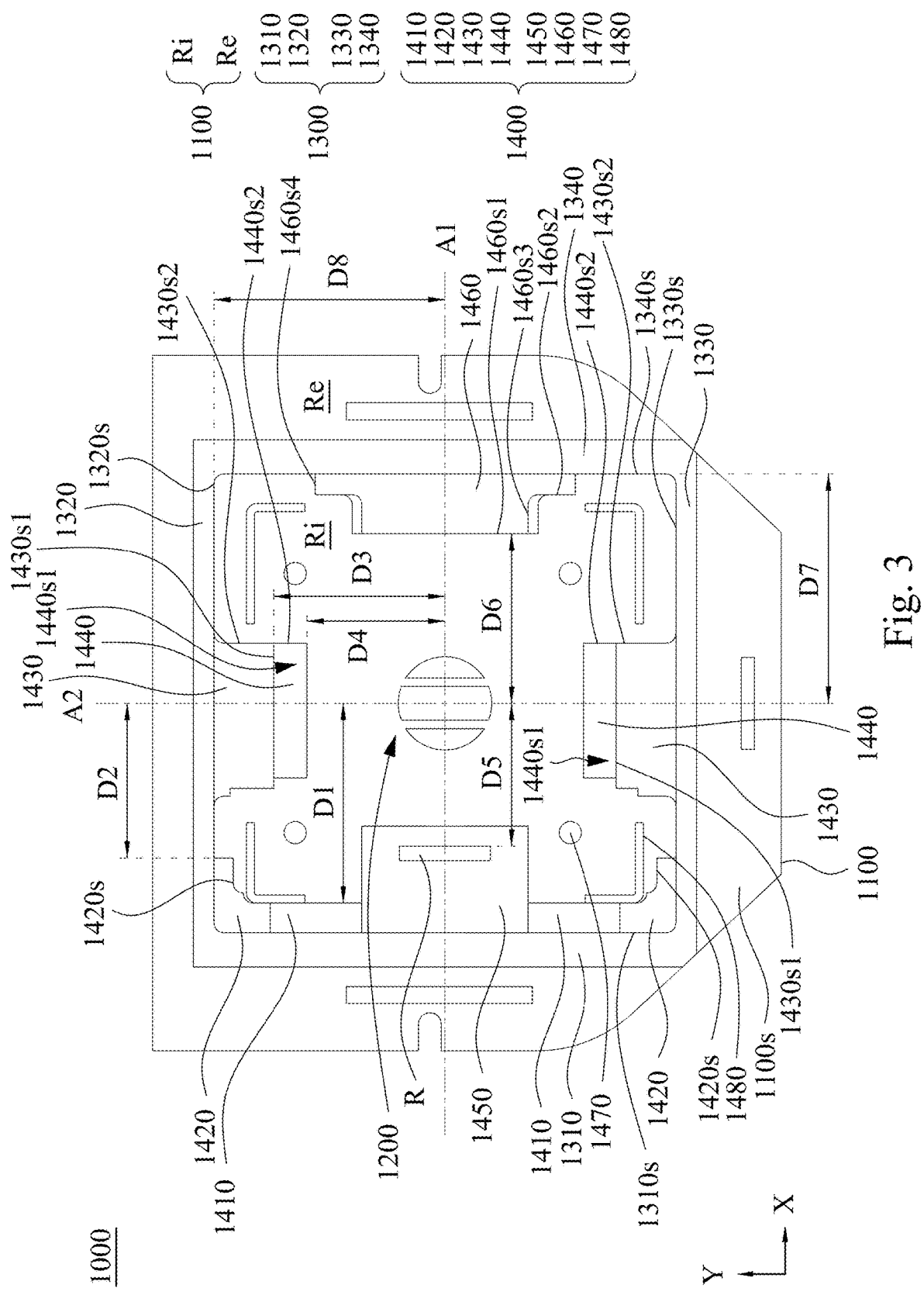
FIG. 3 is a top view of the tray of FIG. 1.

Please refer to FIG. 1 to FIG. 3. FIG. 1 and FIG. 2 are three-dimensional views of a tray 1000 in accordance with one embodiment of the present disclosure. FIG. 3 is a top view of the tray 1000 of FIG. 1.

With reference to FIG. 1, the tray 1000 includes a base plate 1100, a through hole 1200, a wall 1300, and a plurality of positioning features 1400. The through hole 1200 is disposed on a center of the base plate 1100. The wall 1300 extends from a surface 1100s of the base plate 1100 and surrounds the through hole 1200. The wall 1300 separates the base plate 1100 into an interior region Ri and an exterior region Re. The plurality of positioning features 1400 includes a first positioning feature 1410 to an eighth positioning feature 1480. With reference to FIG. 3, the through hole 1200 has a first direction axis A1 and a second direction axis A2 perpendicular to the first direction axis A1. The first direction axis A1 is parallel to a direction X, and the second direction axis A2 is parallel to a direction Y. In some embodiments, the first direction axis A1 and the second direction axis A2 intersects in a center of the through hole 1200. In some embodiments, the tray 1000 could be made by antistatic plastic, such as ultra-high molecular weight polyethylene (UPE), polyoxymethylene (POM), or polyetheretherketone (PEEK).

With reference to the tray 1000 in FIG. 1 to FIG. 3, the wall 1300 is formed by a first wall 1310 having a first inner surface 1310s, a second wall 1320 having a second inner surface 1320s, a third wall 1330 having a third inner surface 1330s, and a fourth wall 1340 having a fourth inner surface 1340s. The second inner surface 1320s and the third inner surface 1330s respectively adjoin and are perpendicular to two sides of the first inner surface 1310s of the wall 1300, and the second inner surface 1320s and the third inner surface 1330s are parallel to each other. The second inner surface 1320s and the third inner surface 1330s respectively adjoin and are perpendicular to two sides of the fourth inner surface 1340s of the wall 1300, and the first inner surface 1310s and the fourth inner surface 1340s are parallel to each other.

As shown in the tray 1000 of FIG. 1 and FIG. 3, a pair of first positioning features 1410 having a first level height H1 are in the interior region Ri and are arranged parallel to the first direction axis A1. Specifically, the pair of first positioning features 1410 are relatively disposed on two sides the first direction axis A1, and the pair of first positioning features 1410 are disposed on the first inner surface 1310s of the wall 1300. More specifically, the first positioning feature 1410 extends along the direction Y and one sidewall of the first positioning feature 1410 contacts the first inner surface 1310s of the wall 1300. The pair of first positioning features 1410 extend from the surface 1100s of the base plate 1100.

As shown in the tray 1000 of FIG. 1 and FIG. 3, a pair of second positioning features 1420 having a second level height H2 are in the interior region Ri and are arranged parallel to the first direction axis A1. Specifically, each of the second positioning features 1420 relatively adjoins each of the first positioning features 1410, and each of the second positioning features 1420 relatively disposed on the second inner surface 1320s or the third inner surface 1330s of the wall 1300. More specifically, one sidewall of the second positioning feature 1420 contacts the first inner surface 1310s of the wall 1300, and another sidewall of the second positioning feature 1320 contacts the second inner surface 1320s or the third inner surface 1330s of the wall 1300. The pair of second positioning features 1420 extend from the surface 1100s of the base plate 1100.

As shown in the tray 1000 of FIG. 1 and FIG. 3, a pair of third positioning features 1430 having a third level height H3 are in the interior region Ri and are arranged parallel to the first direction axis A1. Specifically, the pair of third positioning features 1430 are relatively disposed on two sides the first direction axis A1, and each of the third positioning features 1430 are relatively disposed on the second inner surface 1320s or the third inner surface 1330s of the wall 1300. More specifically, the third positioning feature 1430 extends along the direction X and one sidewall of the third positioning feature 1430 contacts the second inner surface 1320s or the third inner surface 1330s of the wall 1300. The pair of third positioning features 1430 extend from the surface 1100s of the base plate 1100.

As shown in the tray 1000 of FIG. 1 and FIG. 3, a pair of fourth positioning features 1440 having a fourth level height H4 are in the interior region Ri and are arranged parallel to the first direction axis A1. Specifically, the pair of fourth positioning features 1440 are relatively disposed on two sides the first direction axis A1, and each of the fourth positioning features 1440 is relatively disposed on each of the third positioning features 1430. More specifically, the fourth positioning feature 1440 extends along the direction X and one sidewall of the fourth positioning feature 1440 contacts one sidewall of the third positioning feature 1430. The pair of fourth positioning features 1440 extend from the surface 1100s of the base plate 1100.

As shown in the tray 1000 of FIG. 1 and FIG. 3, a fifth positioning feature 1450 having a fifth level height H5 is in the interior region Ri and is arranged between the pair of first positioning features 1410. The fifth positioning feature 1450 further includes a recess R in the fifth positioning feature 1450. Specifically, the fifth positioning feature 1450 extend from the surface 1100s of the base plate 1100. The recess R extends downward to surface 1100s of the base plate 1100. More specifically, the first direction axis A1 passes through a center of the fifth positioning feature 1450 and a center of the recess R.

As shown in the tray 1000 of FIG. 2 and FIG. 3, a sixth positioning feature 1460 having a sixth level height H6 is in the interior region Ri. Specifically, one sidewall of the sixth positioning feature 1460 contacts the fourth inner surface 1340s of the wall 1300. The sixth positioning feature 1460 extends from the surface 1100s of the base plate 1100. More specifically, the first direction axis A1 passes through a center of the sixth positioning feature 1460.

As shown in the tray 1000 of FIG. 1 to FIG. 3, a plurality of seventh positioning features 1470 having a seventh level height are in the interior region Ri. The plurality of seventh positioning features are arranged adjacent to four corners of the wall 1300, and the seventh level height is below the surface 1100s of the base plate 1100. Specifically, the seventh positioning features 1470 are circular recesses in the base plate 1100. A plurality of eighth positioning features 1480 having an eighth level height are in the interior region Ri. The plurality of eighth positioning features are arranged adjacent to four corners of the wall 1300, and the eighth level height is below the surface 1100s of the base plate 1100. Specifically, the eighth positioning features 1480 are L-shaped recesses in the base plate 1100.

It is understood that the first level height H1 of the first positioning feature 1410 is a vertical distance between a top surface of the first positioning feature 1410 and the surface 1100s of the base plate 1100. Similar features are labeled by similar numerical references, and descriptions of the similar features are not repeated herein. Please refer to FIG. 1 and FIG. 2. In some embodiments, the first level height H1, the second level height H2, the third level height H3, the fourth level height H4, and the fifth level height H5 are different from each other. In some embodiments, the first level height H1 is greater than the second level height H2. In some embodiments, the third level height H3 is greater than the fourth level height H4. In some embodiments, the first level height H1 is substantially the same as the fourth level height H4. In some embodiments, the first level height H1 and the second level height H2 are greater than the fifth level height H5. In some embodiments, the sixth level height H6, the third level height H3, and a height of the wall 1300 are the same.

Please refer to FIG. 1 again. The tray 1000 further includes a radio frequency identification (RFID) tag 1500 and a pair of handle structures 1600. The RFID tag 1500 is disposed on the base plate 1100. The RFID tag 1500 is configured for transmitting and receiving information about the tray 1000. The pair of handle structures 1600 extend from the surface 1100s of the base plate 1100 and are disposed in the exterior region Re of the base plate 1100.

Please refer to FIG. 3 again. A minimum distance D1 between the each first positioning feature 1410 and the second direction axis A2 is greater than a minimum distance D2 between the each second positioning feature 1420 and the second direction axis A2. A minimum distance D3 between the each third positioning feature 1430 and the first direction axis A1 is greater than a minimum distance D4 between the each fourth positioning feature 1440 and the first direction axis A1. A distance D8 between the second inner surface 1320s of the wall 1300 and the first direction axis A1 is greater than the minimum distance between D3 the each third positioning feature 1430 and the first direction axis A1. The minimum distance D2 between the each second positioning feature 1420 and the second direction axis A2 is greater than a minimum distance D5 between the recess R of the fifth positioning feature 1450 and the second direction axis A2. A distance D7 between the fourth inner surface 1340s of the wall 1300 and the second direction axis A2 is greater than a minimum distance D6 between the sixth positioning feature 1460 and the second direction axis A2.

Figure 4:
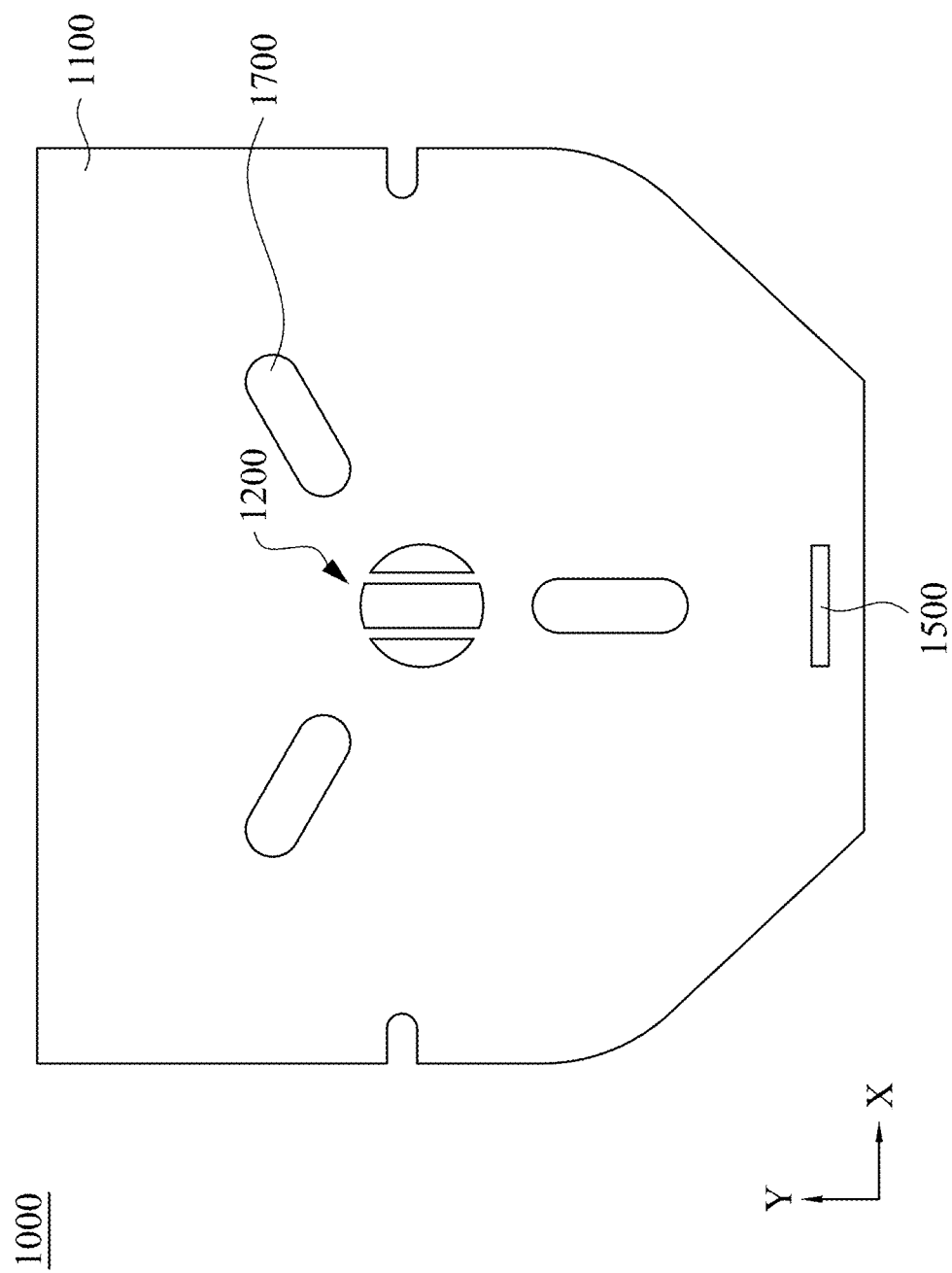
FIG. 4 is a bottom view of the tray of FIG. 1.

FIG. 4 is a bottom view of the tray 1000 of FIG. 1. The tray 1000 further includes a plurality of recesses 1700 disposed in the base plate 1100. The recesses 1700 are configured to be compatible with a rail 5200 (illustrated in FIG. 5 and FIG. 10) to transport or store the tray 1000.

The various positioning features mentioned in the tray 1000 are configured to limit the positions of wafer cassettes (for examples, the wafer cassette C1/C2/C3 mentioned below). The detailed discussion of the wafer cassette C1/C2/C3 will be described in FIG. 6A to FIG. 8C below.

Figure 5:
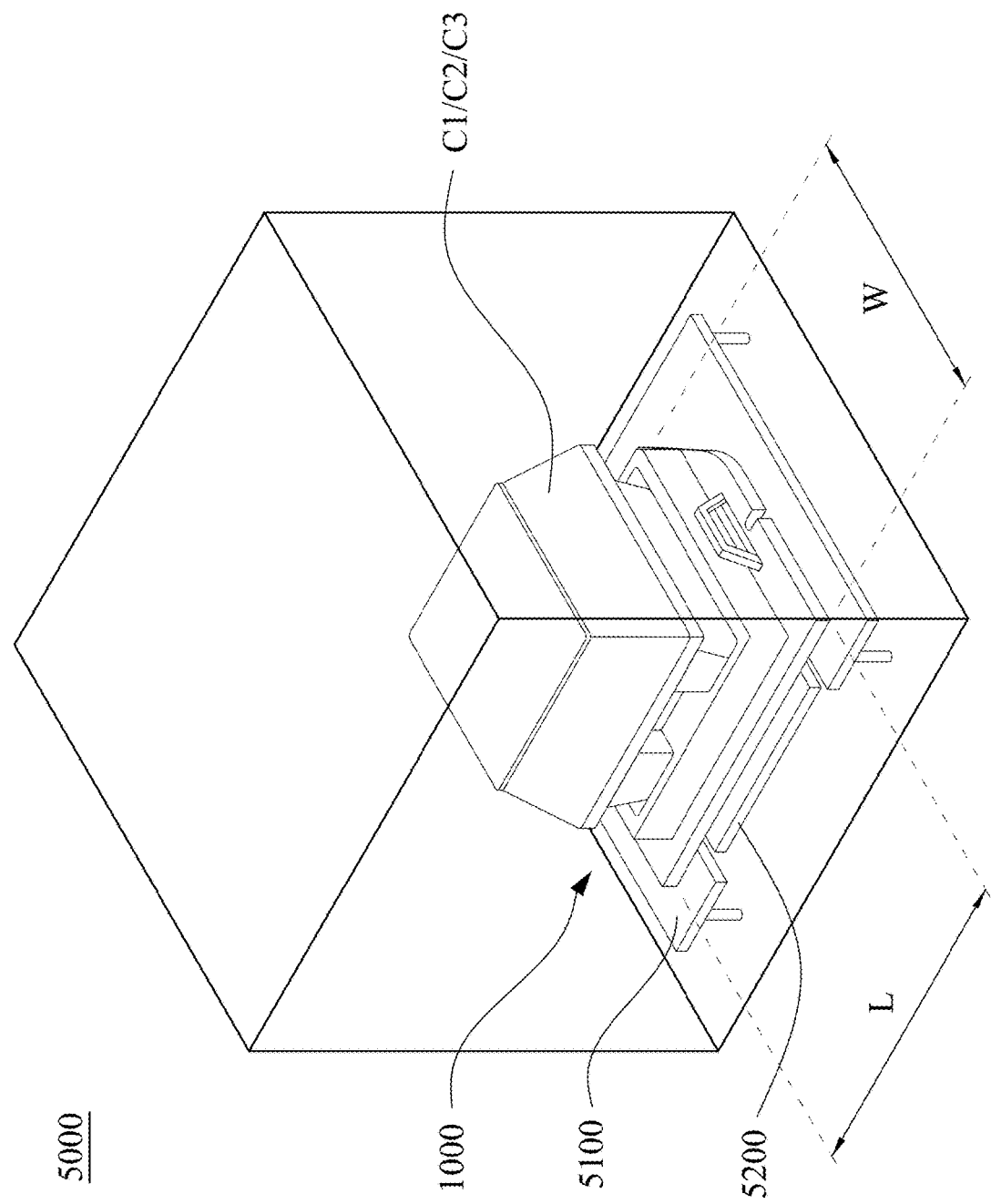
FIG. 5 is a three-dimensional view of a load/unload port in accordance with some embodiments of the present disclosure.
Figure 6A:
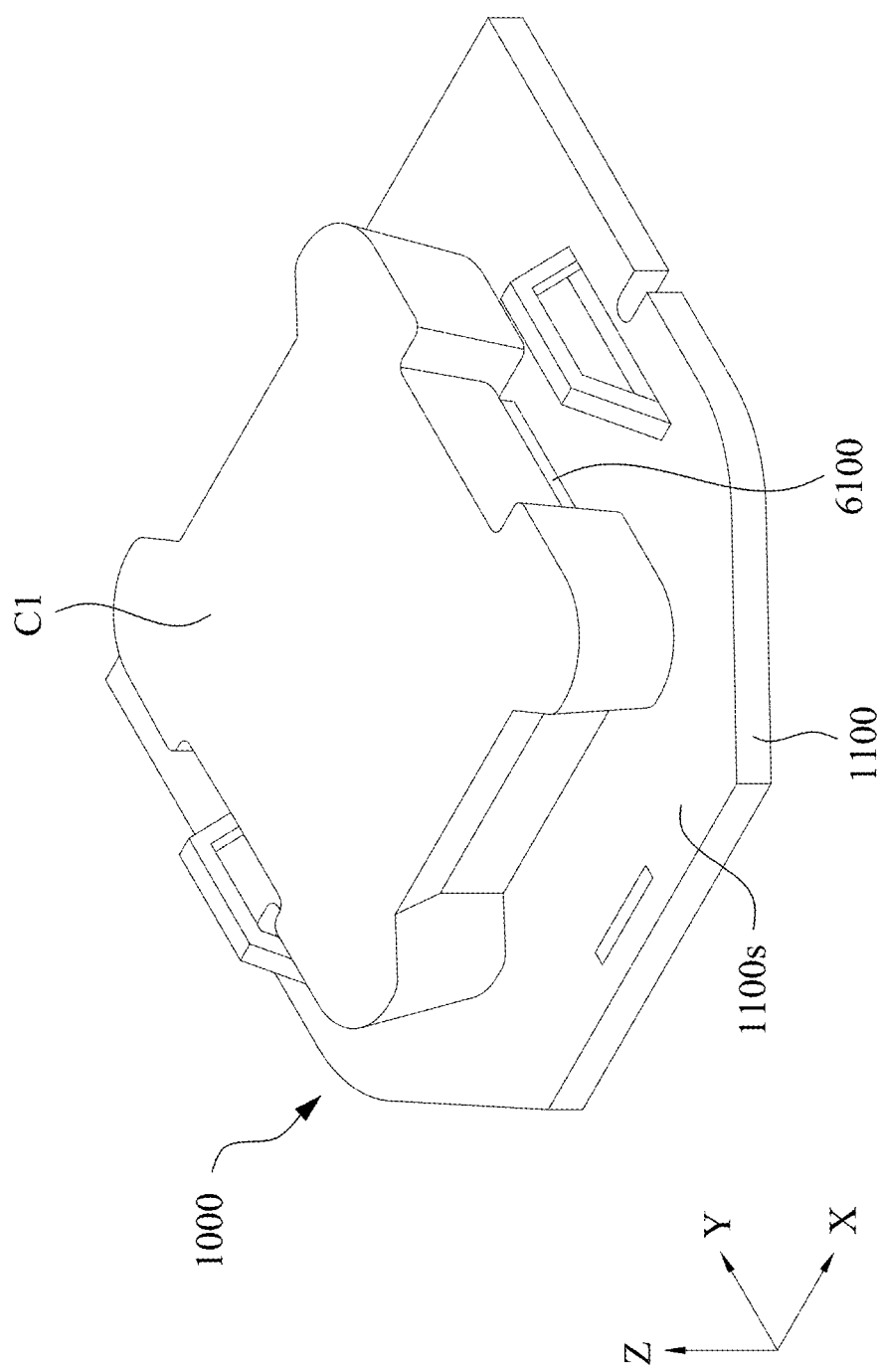
FIG. 6A is a three-dimensional view of a wafer cassette placing on the tray of FIG. 1 in accordance with an example of the present disclosure, in which a wall of the tray is not illustrated.
Figure 6C:
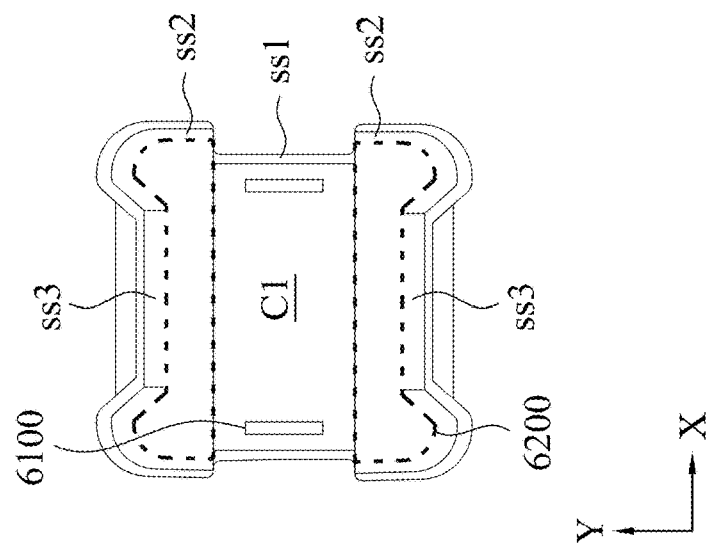
FIG. 6C is a bottom view of the wafer cassette of FIG. 6A.
Figure 6B:
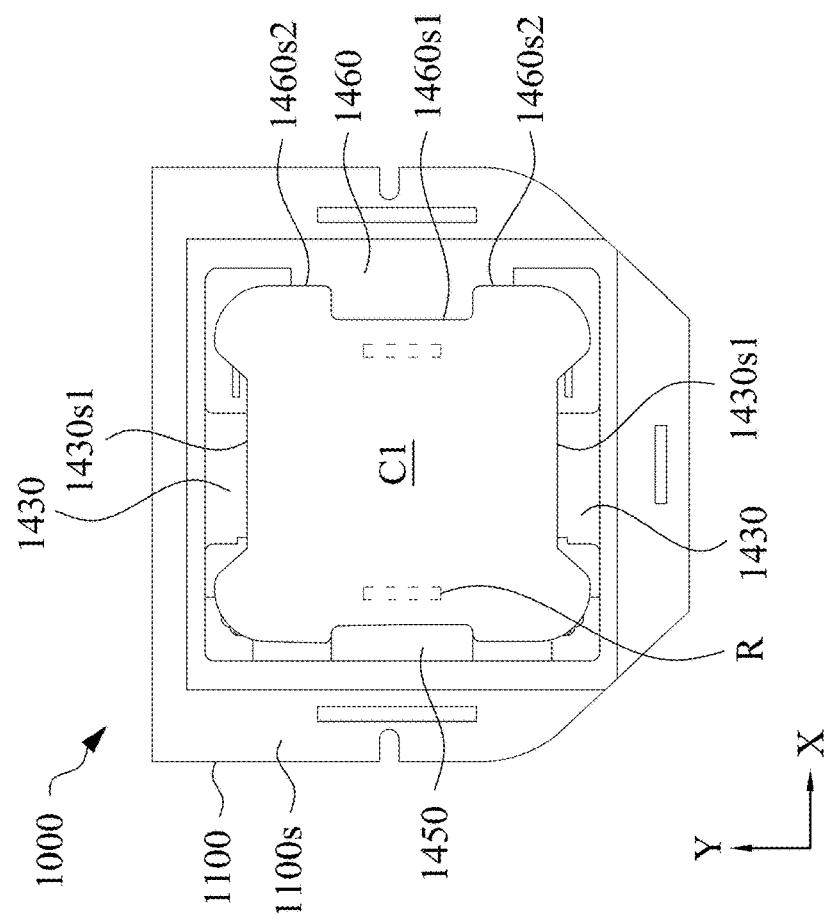
FIG. 6B is a top view of the wafer cassette of FIG. 6A placing on the tray of FIG. 1.
Figure 7A:
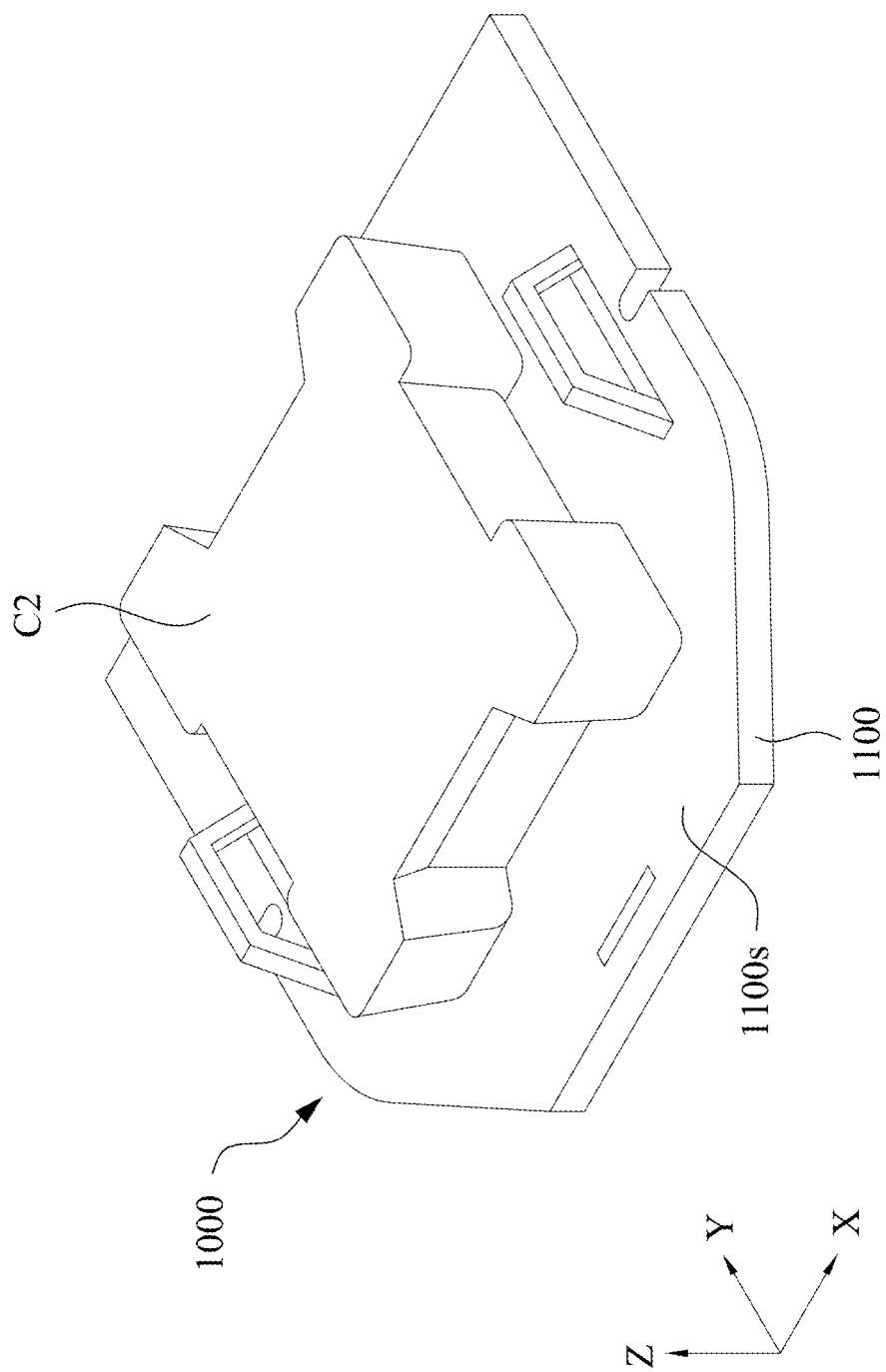
FIG. 7A is a three-dimensional view of a wafer cassette placing on the tray of FIG. 1 in accordance with an example of the present disclosure, in which a wall of the tray is not illustrated.
Figure 7C:
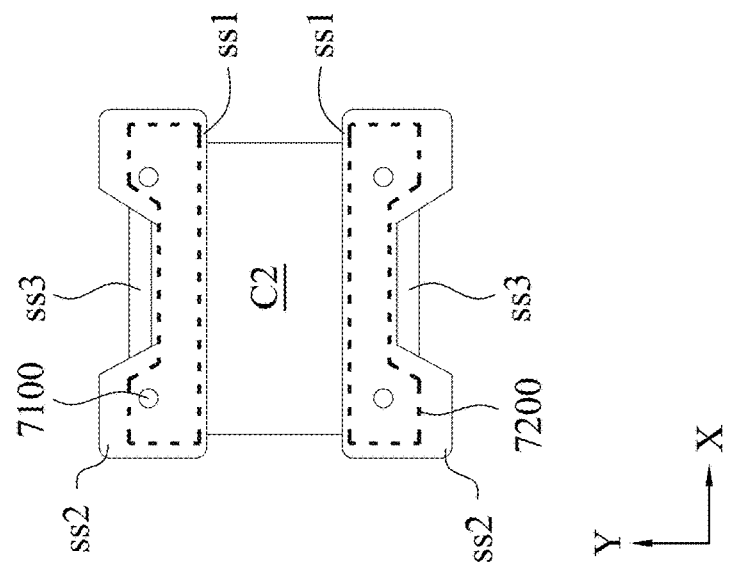
FIG. 7C is a bottom view of the wafer cassette of FIG. 7A.
Figure 7B:
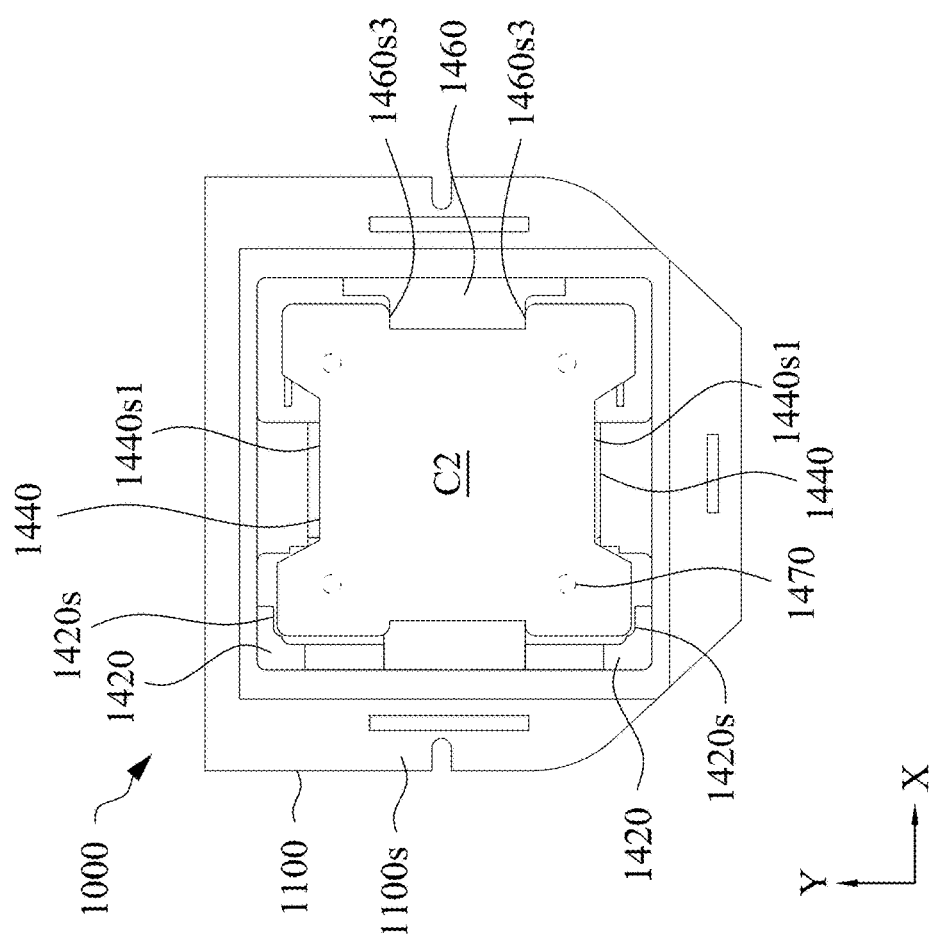
FIG. 7B is a top view of the wafer cassette of FIG. 7A placing on the tray of FIG. 1.
Figure 8A:
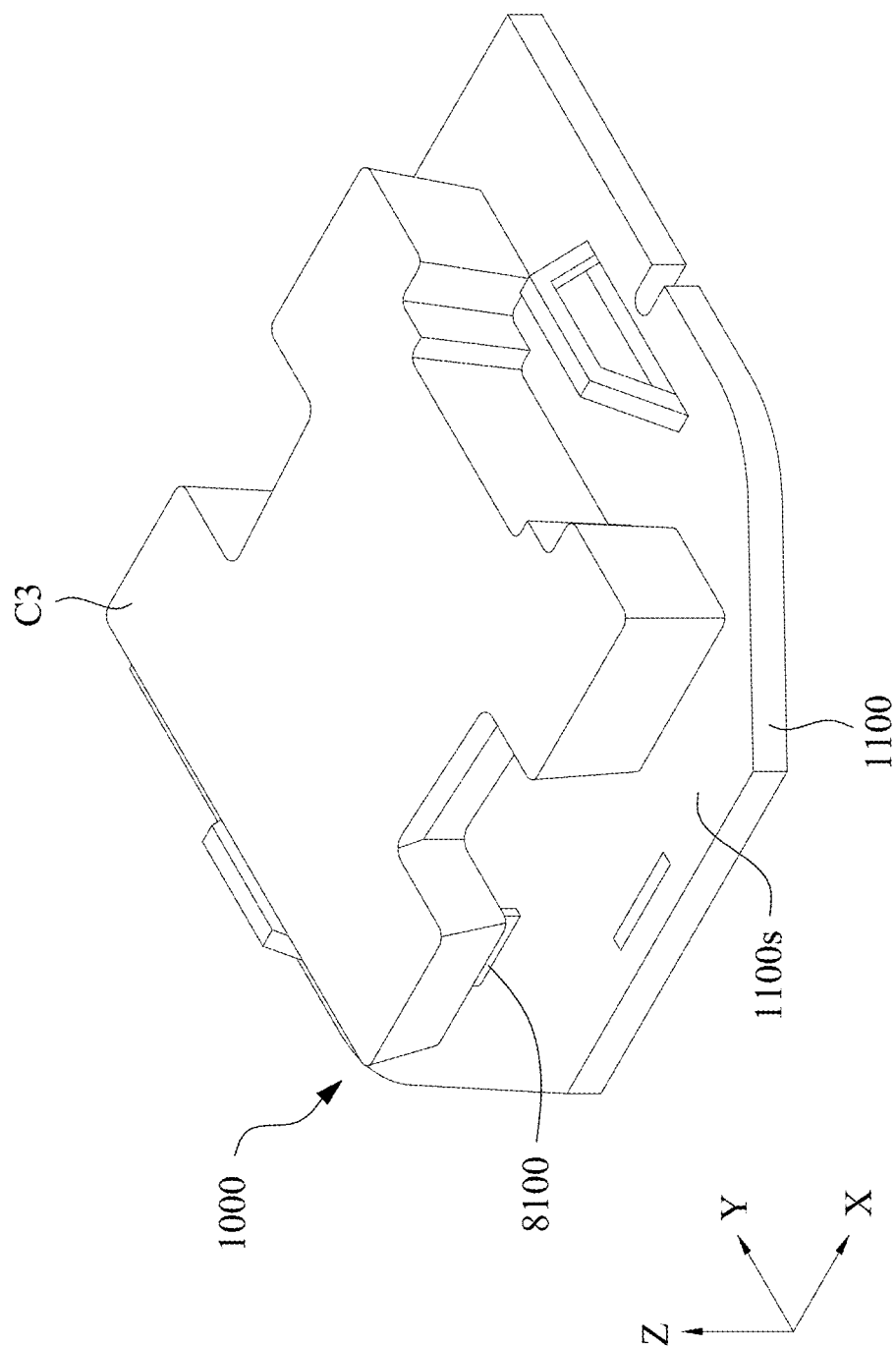
FIG. 8A is a three-dimensional view of a wafer cassette placing on the tray of FIG. 1 in accordance with an example of the present disclosure, in which a wall of the tray is not illustrated.
Figure 8C:
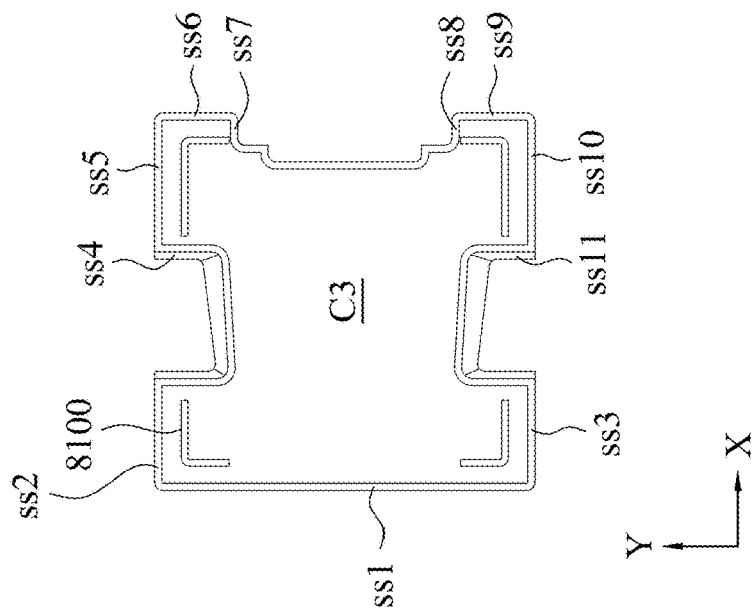
FIG. 8C is a bottom view of the wafer cassette of FIG. 8A.

Please refer to FIG. 5 to FIG. 8C. FIG. 5 is a three-dimensional view of a load/unload port 5000 in accordance with some embodiments of the present disclosure. FIG. 6A to FIG. 6C illustrate various views about the wafer cassette C1. FIG. 7A to FIG. 7C illustrate various views about the wafer cassette C2. FIG. 8A to FIG. 8C illustrate various views about the wafer cassette C3.

In FIG. 5, a wafer cassette C1/C2/C3 and the tray 1000 of FIG. 1 are placed in the load/unload port 5000, and the wafer cassette C1/C2/C3 is disposed on the tray 1000. The wafer cassettes C1, C2, C3 herein represent different types of wafer cassettes. The load/unload port 5000 includes a load/unload platform 5100 and the rail 5200. The load/unload platform 5100 and the rail 5200 are disposed under the tray 1000. A RFID (not shown) reader is disposed under the tray 1000 to track, identify, and manage the trays 1000 through the RFID tag 1500 (shown in FIG. 1). An infrared sensor is disposed on the rail 5200 to determine the position of the tray 1000 through the through hole 1200.

Figure 8B:
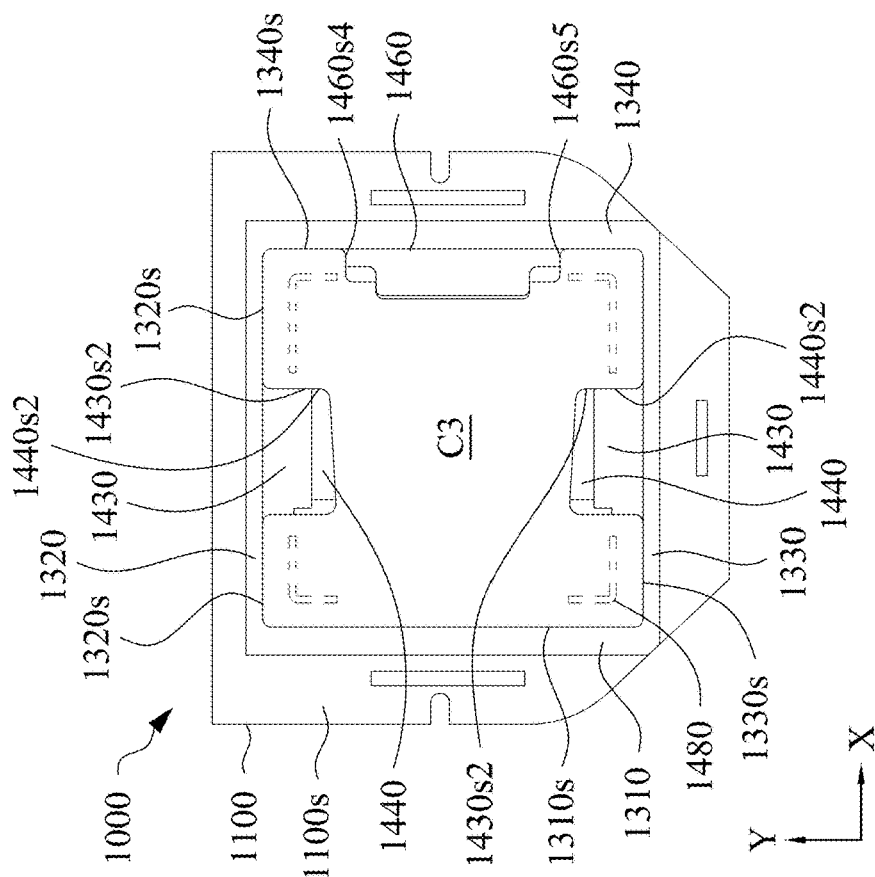
FIG. 8B is a top view of the wafer cassette of FIG. 8A placing on the tray of FIG. 1.

It is understood that the wafer cassette C1/C2/C3 shown in FIG. 5 could be the wafer cassette C1 illustrated in FIG. 6A to FIG. 6C, the wafer cassette C2 illustrated in FIG. 7A to FIG. 7C, and the wafer cassette C3 illustrated in FIG. 8A to FIG. 8C, respectively. In addition, FIG. 6A to FIG. 8C merely illustrate the bottom portions of the wafer cassette C1/C2/C3 for clarity of discussion. The wafer cassette C1/C2/C3 is respectively put on the surface 1100s of the base plate 1100 and fit in the tray 1000 by a plurality of positioning features and surfaces (including side surfaces and top surfaces) thereon of the tray 1000. Each of the positioning features in the tray 1000 corresponds to the features in the wafer cassette C1/C2/C3, respectively. Specifically, the tray 1000 is compatible with the different types of wafer cassettes C1, C2, C3.

FIG. 6A is a three-dimensional view of the wafer cassette C1 placing on the tray 1000 of FIG. 1 in accordance with an example of the present disclosure, in which a wall 1300 of the tray 1000 is not illustrated for clarity. FIG. 6B is a top view of the wafer cassette C1 of FIG. 6A placing on the tray 1000 of FIG. 1. FIG. 6C is a bottom view of the wafer cassette C1 of FIG. 6A.

When the wafer cassette C1 is disposed on the surface 1100s of the base plate 1100, there are two bottom contact surfaces 6200 (illustrated by dot lines) shown in FIG. 6C. The bottom contact surfaces 6200 are contact surfaces between the wafer cassette C1 and the surface 1100s of the tray 1000. The wafer cassette C1 includes a pair of convex parts 6100, as shown in FIG. 6A and FIG. 6C. Please refer to FIG. 3, FIG. 6B, and FIG. 6C, one of the convex parts 6100 is configured to fit the recess R of the fifth positioning feature 1450 of the tray 1000. Please refer to FIG. 6B and FIG. 6C. A side surface ss1 of the wafer cassette C1 contacts a side surface 1460s1 of the sixth positioning feature 1460. Side surfaces ss2 of the wafer cassette C1 contacts side surfaces 1460s2 of the sixth positioning feature 1460. Side surfaces ss3 of the wafer cassette C1 contact side surfaces 1430s1 of the third positioning features 1430. It is understood that the side surface ss1, the side surfaces ss2, and the side surfaces ss3 are oblique surfaces or arc surfaces.

In other words, a bottom level height in the vertical direction (the direction Z) of the wafer cassette C1 is determined by the bottom contact surfaces 6200 of the wafer cassette C1. The horizontal position in the direction X and the direction Y of the wafer cassette C1 is determined by the side surface ss1, the side surfaces ss2, and the side surfaces ss3 of the wafer cassette C1.

FIG. 7A is a three-dimensional view of a wafer cassette C2 placing on the tray 1000 of FIG. 1 in accordance with an example of the present disclosure, in which a wall of the tray is not illustrated for clarity. FIG. 7B is a top view of the wafer cassette C2 of FIG. 7A placing on the tray of FIG. 1. FIG. 7C is a bottom view of the wafer cassette C2 of FIG. 7A.

When the wafer cassette C2 is disposed on the surface 1100s of the base plate 1100, there are two bottom contact surfaces 7200 (illustrated by dot lines) shown in FIG. 7C. The bottom contact surfaces 7200 are contact surfaces between the wafer cassette C2 and the surface 1100s of the tray 1000. The wafer cassette C2 includes a plurality of convex parts 7100 adjacent to four corners of the wafer cassette C2, as shown in FIG. 7C. Please refer to FIG. 3, FIG. 7B, and FIG. 7C, each of the convex parts 7200 is configured to fit each of the seventh positioning features 1470 of the tray 1000. Please refer to FIG. 7B and FIG. 7C, side surfaces ss1 of the wafer cassette C2 contact side surfaces 1460s3 of the sixth positioning feature 1460. Side surfaces ss2 of the wafer cassette C2 contacts side surfaces 1420s of the second positioning feature 1420. Side surfaces ss3 of the wafer cassette C2 contact top surfaces 1440s1 of the fourth positioning features 1440. It is understood that the side surfaces ss1, the side surfaces ss2, and the side surfaces ss3 are oblique surfaces or arc surfaces.

In other words, a bottom level height in the vertical direction (the direction Z) of the wafer cassette C2 is determined by the convex parts 7100 and the bottom contact surfaces 7200 of the wafer cassette C2. The horizontal position in the direction X and the direction Y of the wafer cassette C2 is determined by the side surfaces ss1, the side surfaces ss2, and the side surfaces ss3 of the wafer cassette C2.

FIG. 8A is a three-dimensional view of a wafer cassette C3 placing on the tray 1000 of FIG. 1 in accordance with an example of the present disclosure, in which a wall of the tray is not illustrated for clarity. FIG. 8B is a top view of the wafer cassette C3 of FIG. 8A placing on the tray of FIG. 1. FIG. 8C is a bottom view of the wafer cassette C3 of FIG. 8A.

As shown in FIG. 8A and FIG. 8C, the wafer cassette C3 includes a plurality of convex parts 8100 adjacent to four corners of the wafer cassette C3, and each of the convex parts 8100 has a L-shapes structure. Please refer to FIG. 3 and FIG. 8A to FIG. 8C, each of the convex parts 8100 is configured to fit each of the eights positioning features 1480 of the tray 1000. Please refer to FIG. 8B and FIG. 8C, a side surface ss1 of the wafer cassette C3 contacts the first inner surface 1310s of the first wall 1310. A side surface ss2 of the wafer cassette C3 contacts the second inner surface 1320s of the second wall 1320. A side surface ss3 of the wafer cassette C3 contacts the third inner surface 1330s of the third wall 1330. A side surface ss4 of the wafer cassette C3 contacts a side surface 1430s2 of the third positioning feature 1430 and a side surface 1440s2 of the fourth positioning feature 1440. A side surface ss5 of the wafer cassette C3 contacts the second inner surface 1320s of the second wall 1320. A side surface ss6 of the wafer cassette C3 contacts the fourth inner surface 1340s of the fourth wall 1340. A side surface ss7 of the wafer cassette C3 contacts a side surface 1460s4 of the sixth positioning feature 1460. A side surface ss8 of the wafer cassette C3 contacts a side surface 1460s5 of the sixth positioning feature 1460. A side surface ss9 of the wafer cassette C3 contacts the fourth inner surface 1340s of the fourth wall 1340. A side surface ss10 of the wafer cassette C3 contacts the third inner surface 1330s of the third wall 1330. A side surface ss11 of the wafer cassette C3 contacts a side surface 1430s2 of the third positioning feature 1430 and a side surface 1440s2 of the fourth positioning feature 1440. It is understood that the side surface ss1 to the side surface ss11 are oblique surfaces or arc surfaces.

In other words, a bottom level height in the vertical direction (the direction Z) of the wafer cassette C3 is determined by the convex parts 8100 of the wafer cassette C3. The horizontal position in the direction X and the direction Y of the wafer cassette C3 is determined by the side surface ss1 to the side surface ss11 of the wafer cassette C3.

Figure 9:
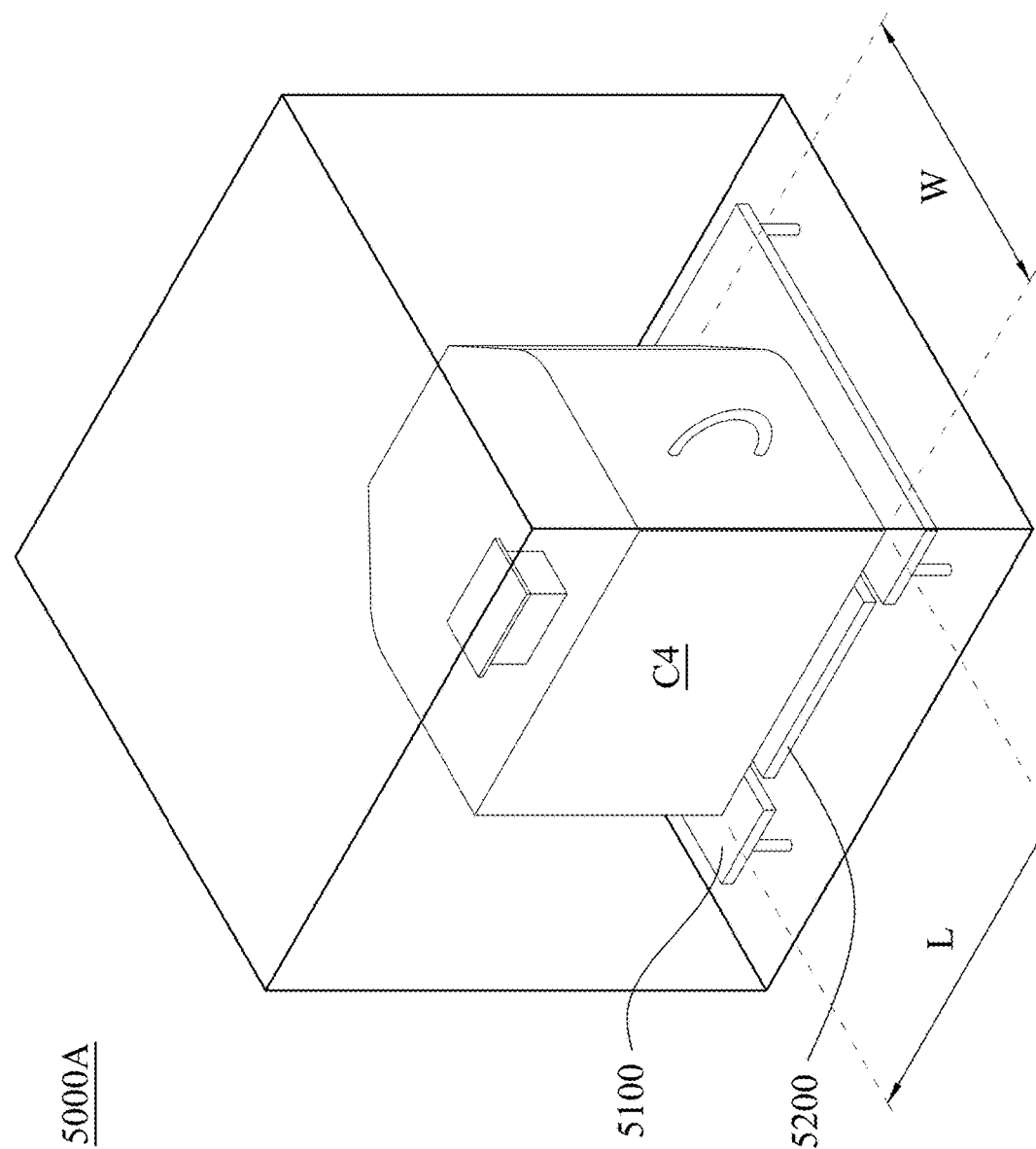
FIG. 9 is a three-dimensional view of a load/unload port in accordance with some embodiments of the present disclosure.

FIG. 9 is a three-dimensional view of a load/unload port 5000A in accordance with some embodiments of the present disclosure. It is understood that the wafer cassette C1/C2/C3 and the tray 1000 shown in FIG. 5 are replaced by a wafer cassette C4. The wafer cassette C4 is placed in the load/unload port 5000A, and the wafer cassette C4 is disposed on the load/unload platform 5100. In some embodiments, a bottom structure of the wafer cassette C4 has the same structure that shown in FIG. 4, therefore, both the wafer cassette C4 and the wafer cassette C1/C2/C3 could be compatible with the rail 5200 (shown in FIG. 5 and FIG. 10).

Please refer to FIG. 5 and FIG. 9. A width W of the tray 1000 is the same as a width W of the wafer cassette C4. A length L of the tray 1000 is the same as a length L of the wafer cassette C4. The wafer cassette C1/C2/C3 is used for a smaller size wafer relative the wafer cassette C4. For example, the wafer cassette C1/C2/C3 could be a 8-inch wafer cassette, and the wafer cassette C4 could be a 12-inch wafer cassette. For another example, the wafer cassette C1/C2/C3 could be a 8-inch or 12-inch wafer cassette, and the wafer cassette C4 could be a 20-inch wafer cassette. However, other sizes of wafer cassettes are also included in the present disclosure. The wafer cassette C1/C2/C3 and the wafer cassette C4 are front opening unified pods (FOUP). It could be understood that the tray 1000 could be an intermedium between the wafer cassette C1/C2/C3 and the rail 5200.

Figure 10:
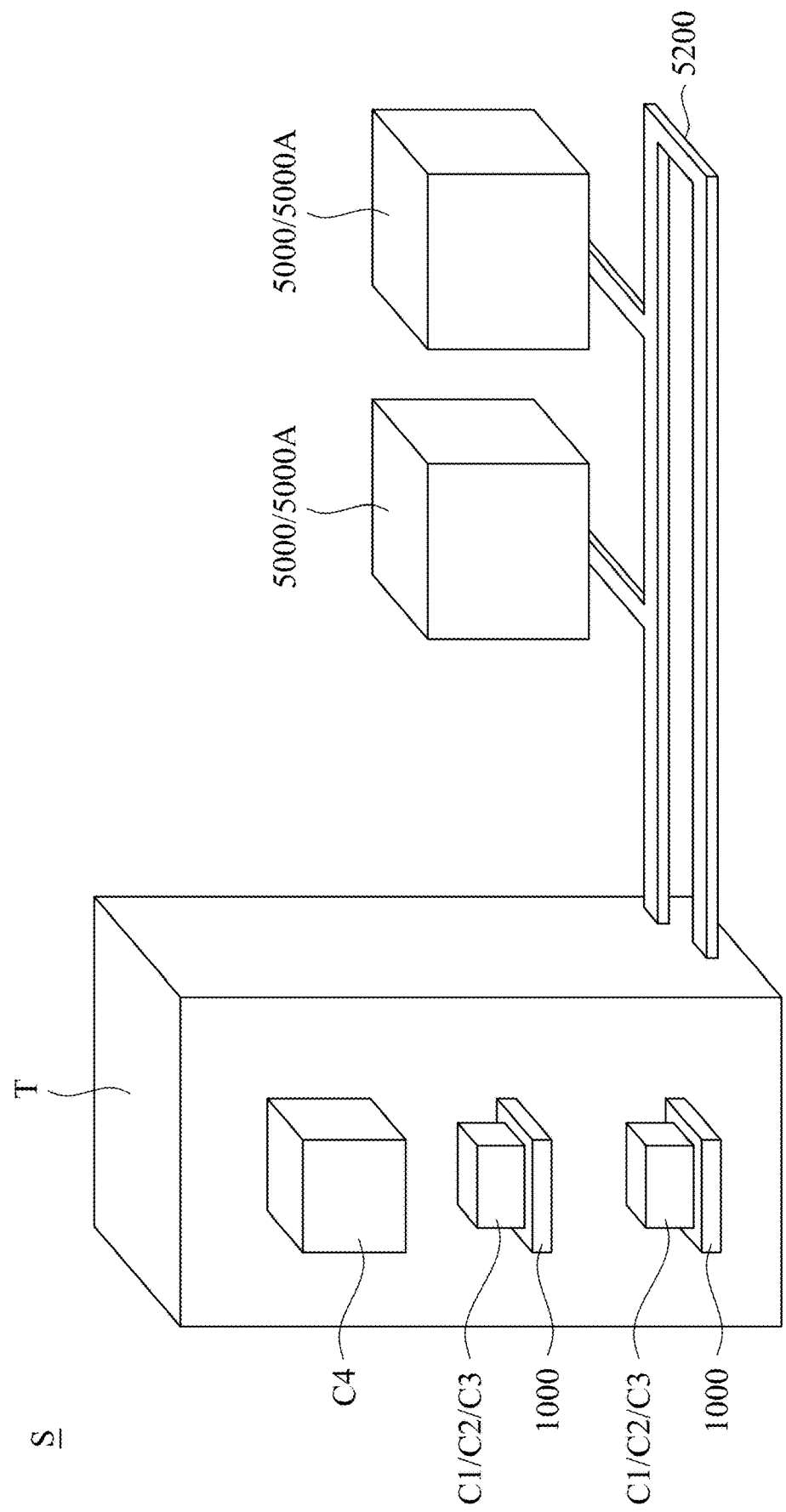
FIG. 10 is a three-dimensional view of a transfer system for wafer cassettes in accordance with some embodiments of the present disclosure.

FIG. 10 is a three-dimensional view of a transfer system S for wafer cassettes C1, C2, C3, C4 in accordance with some embodiments of the present disclosure. The transfer system S includes a stocker T, the rail 5200, and the load/unload port 5000/5000A. The wafer cassette C4 and the wafer cassette C1/C2/C3 with the tray 1000 are in a stocker T. The rail 5200 is configured to transport the wafer cassettes C1, C2, C3, C4. Because the bottom sizes and structures of the tray 1000 and the wafer cassette C4 are the same, both the tray 1000 and the wafer cassette C4 are compatible with the rail 5200, thereby increasing the diversity and commonality of wafer automatic transportations. It is understood that the number of the wafer cassette C1/C2/C3 with the tray 1000 and the number of the C4 are not limited in the view shown in FIG. 10.

Figure 11:
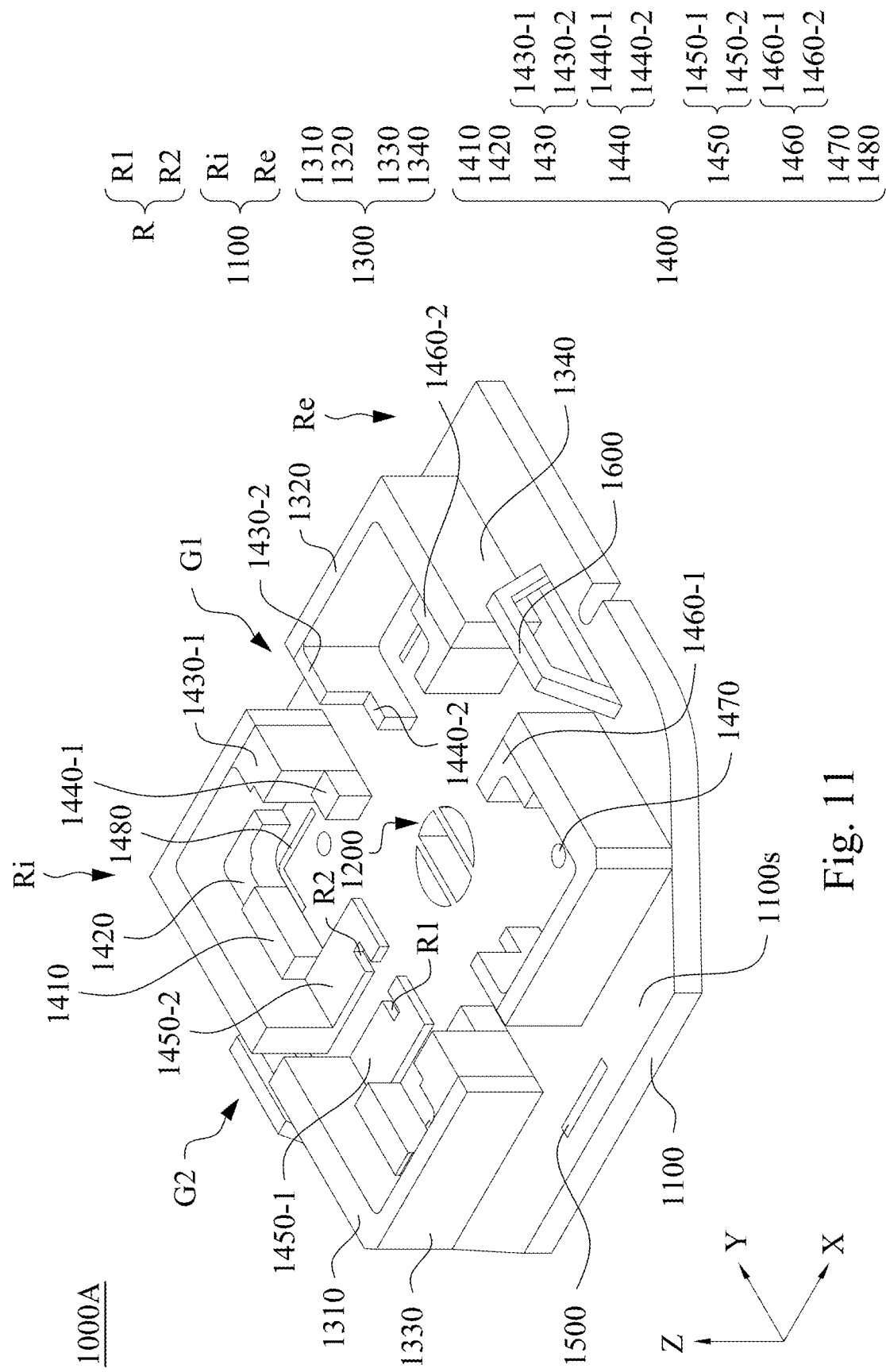
FIG. 11 and FIG. 12 are three-dimensional views of a tray in accordance with an alternative embodiment of the present disclosure.
Figure 12:
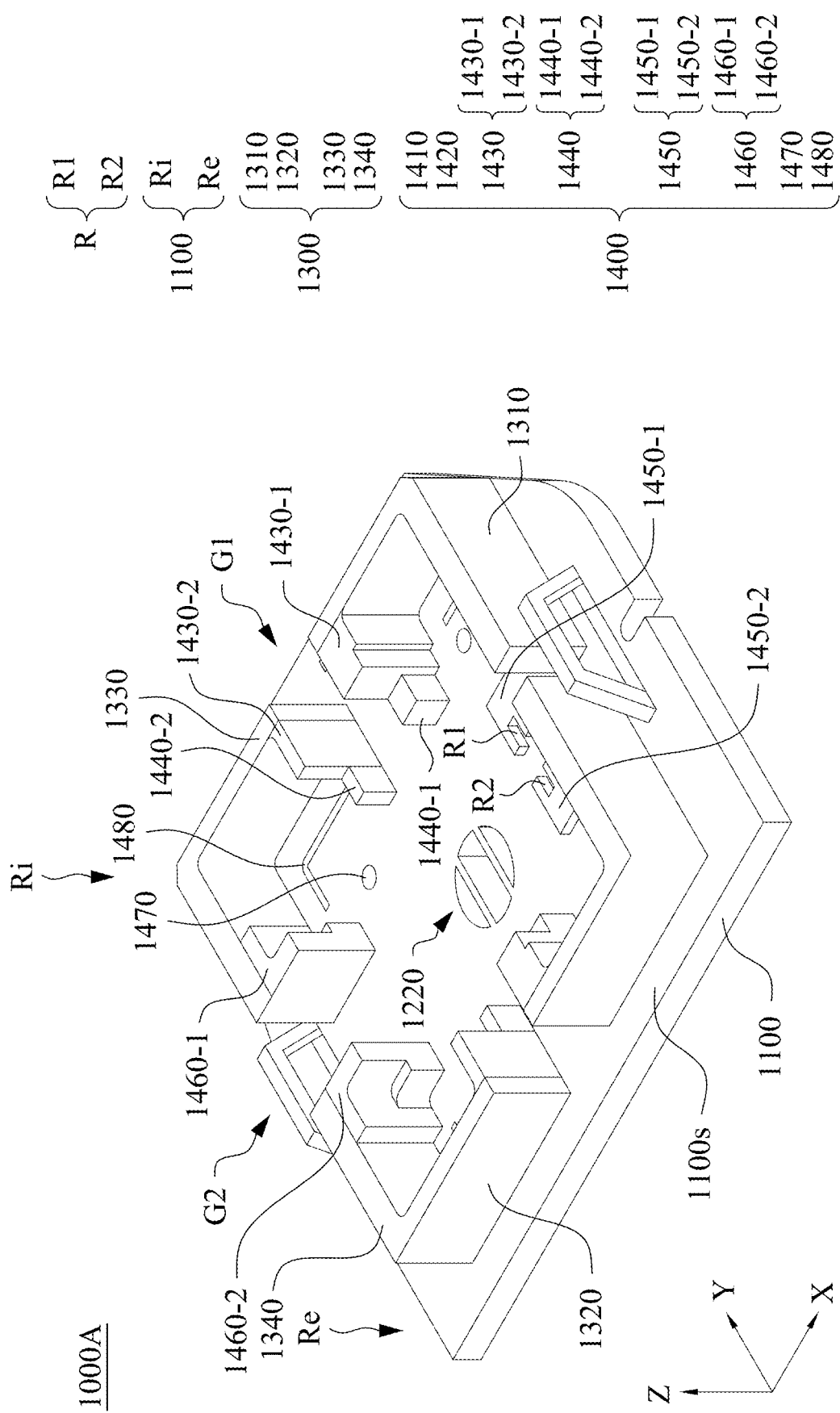
Figure 13:
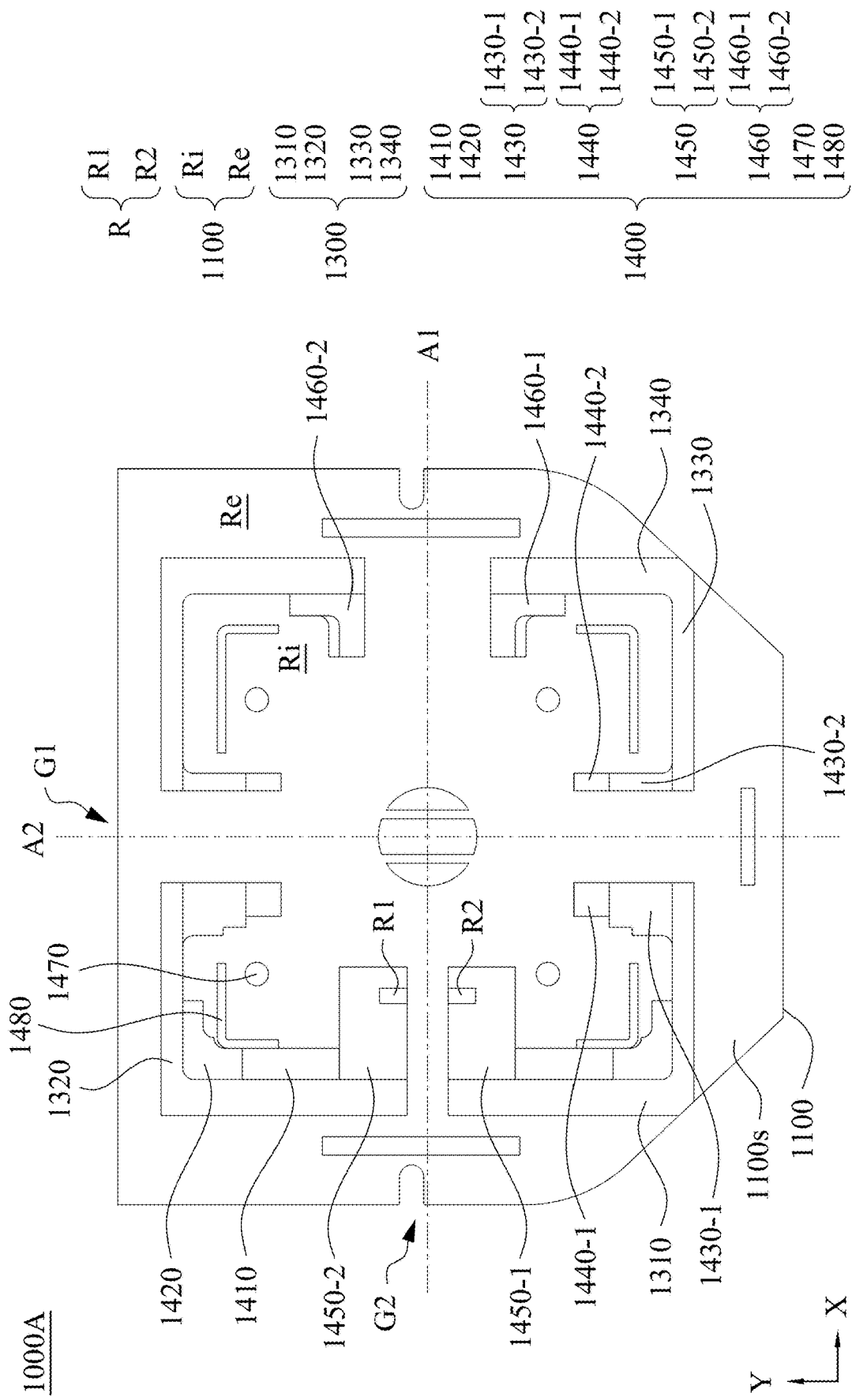
FIG. 13 is a top view of the tray of FIG. 11.

FIG. 11 and FIG. 12 are three-dimensional views of a tray 1000A in accordance with an alternative embodiment of the present disclosure. FIG. 13 is a top view of the tray 1000A of FIG. 11. The differences between the tray 1000A of FIG. 11 and the tray 1000 of FIG. 1 are that, the tray 1000A of FIG. 11 further includes a first gap channel G1 and a second gap channel G2.

As shown in FIG. 11 to FIG. 13, the first gap channel G1 separates each of the third positioning features 1430 into two third portions 1430-1, 1430-2 and separates each of the fourth positioning features 1440 into two fourth portions 1440-1, 1440-2. The second gap channel G2 separates the fifth positioning feature 1450 into two fifth portions 1450-1, 1450-2 and separates the sixth positioning feature 1460 into two sixth portions 1460-1, 1460-2. Specifically, the recess R are separated into two recesses R1, R2. More specifically, the first gap channel G1 separates the second wall 1320 into two second walls and separates the third wall 1330 into two third walls. The second gap channel G2 separates the first wall 1310 into two first walls and separates the fourth wall 1340 into two fourth walls.

In FIG. 11 to FIG. 13, reference numerals are repeated herein to show the same or similar features shown in FIG. 1 to FIG. 3, and the description above applies equally to the embodiments described below, and the details thereof are not repeatedly described. Furthermore, the above-mentioned tray 1000 in FIGS. 5, 6A, 6B, 7A, 7B, 8A, 8B, and 10 could be replaced by the tray 1000A in FIG. 11. A bottom view of the tray 1000A in FIG. 11 could be the same as that of the tray 1000 in FIG. 4.

The present disclosure provides two kinds of trays of transfer systems for wafer cassettes. The disclosed trays could be compatible with different types of wafer cassettes for the same wafer size. The bottom sizes and bottom structures of the disclosed trays are the same as the other wafer cassette(s) which is no need of the disclosed trays. Therefore, both the disclosed trays and the other wafer cassette(s) are compatible with the same rail, thereby increasing the diversity and commonality of wafer automatic transportations and reducing the production cost of semiconductor factory.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transfer system for wafer cassettes, comprising:
a tray, comprising:
 a base plate;
 a through hole disposed on a center of the base plate, wherein the through hole has a first direction axis and a second direction axis perpendicular to the first direction axis;
 a wall extending from a surface of the base plate and surrounding the through hole, wherein the wall separates the base plate into an interior region and an exterior region;
 a pair of first positioning features having a first level height in the interior region and arranged parallel to the first direction axis;
 a pair of second positioning features having a second level height in the interior region and arranged parallel to the first direction axis, wherein the first level height is greater than the second level height;
 a pair of third positioning features having a third level height in the interior region and arranged parallel to the first direction axis;
 a pair of fourth positioning features having a fourth level height in the interior region and arranged parallel to the first direction axis, wherein the third level height is greater than the fourth level height;
 wherein a minimum distance between the each first positioning feature and the second direction axis is greater than a minimum distance between the each second positioning feature and the second direction axis,
 wherein a minimum distance between the each third positioning feature and the first direction axis is greater than a minimum distance between the each fourth positioning feature and the first direction axis; and
a rail compatible with the tray.

2. The transfer system of claim 1, wherein the first direction axis and the second direction axis intersect in a center of the through hole.

3. The transfer system of claim 1, wherein the wall comprises a first inner surface, a second inner surface, a third inner surface, and a fourth inner surface,
 wherein the second inner surface and the third inner surface respectively adjoin and are perpendicular to two sides of the first inner surface of the wall, and the second inner surface and the third inner surface are parallel to each other,
 wherein the second inner surface and the third inner surface respectively adjoin and are perpendicular to two sides of the fourth inner surface of the wall, and the first inner surface and the fourth inner surface are parallel to each other,
 wherein a distance between the second inner surface of the wall and the first direction axis is greater than the minimum distance between the each third positioning feature and the first direction axis.

4. The transfer system of claim 3, wherein the pair of first positioning features are relatively disposed on two sides the first direction axis, and the pair of first positioning features are disposed on the first inner surface of the wall.

5. The transfer system of claim 4, wherein each of the second positioning features relatively adjoins each of the first positioning features, and each of the second positioning features relatively is disposed on the second inner surface and the third inner surface of the wall.

6. The transfer system of claim 3, wherein the pair of third positioning features are relatively disposed on two sides the first direction axis, and each of the third positioning features is relatively disposed on the second inner surface and the third inner surface of the wall.

7. The transfer system of claim 6, wherein the pair of fourth positioning features are relatively disposed on two sides the first direction axis, and each of the fourth positioning features is relatively disposed on each of the third positioning features.

8. The transfer system of claim 3, further comprising a fifth positioning feature having a fifth level height in the interior region and arranged between the pair of first positioning features, wherein the first level height and the second level height are greater than the fifth level height.

9. The transfer system of claim 8, further comprising a recess in the fifth positioning feature.

10. The transfer system of claim 9, wherein the first direction axis passes through a center of the fifth positioning feature and a center of the recess.

11. The transfer system of claim 9, wherein the minimum distance between the each second positioning feature and the second direction axis is greater than a minimum distance between the recess of the fifth positioning feature and the second direction axis.

12. The transfer system of claim 8, further comprising a sixth positioning feature having a sixth level height in the interior region,
 wherein a distance between the fourth inner surface of the wall and the second direction axis is greater than a minimum distance between the sixth positioning feature and the second direction axis.

13. The transfer system of claim 12, wherein the first direction axis passes through a center of the sixth positioning feature.

14. The transfer system of claim 12, further comprising a first gap channel and a second gap channel,
 wherein the first gap channel separates each of the third positioning features into two third portions and separates each of the fourth positioning features into two fourth portions,
 wherein the second gap channel separates the fifth positioning feature into two fifth portions and separates the sixth positioning feature into two sixth portions.

15. The transfer system of claim 1, wherein the pair of first positioning features, the pair of second positioning features, the pair of third positioning features, and the pair of fourth positioning features extend from the surface of the base plate.

16. The transfer system of claim 1, further comprising a plurality of seventh positioning features having a seventh level height in the interior region and a plurality of eighth positioning features having an eighth level height in the interior region,
 wherein the plurality of seventh positioning features are arranged adjacent to four corners of the wall, and the seventh level height is below the surface of the base plate,
 wherein the plurality of eighth positioning features are arranged adjacent to four corners of the wall, and the eighth level height is below the surface of the base plate.

17. The transfer system of claim 1, further comprising different types of first wafer cassettes in the transfer system, and the tray is compatible with the different types of first wafer cassettes.

18. The transfer system of claim 17, further comprising a second wafer cassette in the transfer system,
   wherein a length of the tray is the same as a length of the second wafer cassette, and a width of the tray is the same as a width of the second wafer cassette.

19. The transfer system of claim 1, further comprising a radio frequency identification tag disposed on the base plate.

20. The transfer system of claim 1, further comprising a pair of handle structures extending from the surface of the base plate and disposed in the exterior region.

* * * * *